United States Patent [19]
Baker et al.

[11] Patent Number: 6,073,151
[45] Date of Patent: Jun. 6, 2000

[54] BIT-SERIAL LINEAR INTERPOLATOR WITH SLICED OUTPUT

[75] Inventors: James Clark Baker, Crystal Lake; Denise Carol Riemer, Gurnee; John Paul Oliver, Chicago, all of Ill.

[73] Assignee: Motorola, Inc., Schaumburg, Ill.

[21] Appl. No.: 09/106,476

[22] Filed: Jun. 29, 1998

[51] Int. Cl.[7] ...................................................... G06F 7/38
[52] U.S. Cl. ............................................................. 708/290
[58] Field of Search .................................... 708/290, 313

[56] References Cited

U.S. PATENT DOCUMENTS

| | | |
|---|---|---|
| 3,789,203 | 1/1974 | Catherall et al. ......................... 708/290 |
| 4,031,370 | 6/1977 | Catherall ................................. 708/290 |
| 4,648,045 | 3/1987 | Demetrescu .............................. 395/505 |
| 4,975,866 | 12/1990 | Aoki et al. ............................... 708/290 |
| 5,559,513 | 9/1996 | Rothermel et al. ........................ 341/61 |
| 5,694,345 | 12/1997 | Peterson .................................. 708/290 |

Primary Examiner—Chuong Dinh Ngo
Attorney, Agent, or Firm—Paul J. Bartusiak

[57] ABSTRACT

Delayed versions of a bit-serial input sequence are created. When the interpolation involves scaled versions of the input sequence, scaled versions of the input sequence are produced. The interpolation equations are implemented by adding the delayed versions of the input sequence and the scaled versions of the input sequence together. The sign bit of each of the equated interpolation terms are applied to a multiplexer (528), and the sign bits are sequentially produced at the multiplexer output (529). The multiplexed sign bits are sequentially latched to the output of a latch (534) to produce the bit-serial interpolation with sliced output signal.

22 Claims, 5 Drawing Sheets

6,073,151

BIT-SERIAL LINEAR INTERPOLATOR WITH SLICED OUTPUT

FIELD OF THE INVENTION

This invention relates generally to digital signal processing, and more particularly to a bit-serial linear interpolator with a sliced output.

BACKGROUND OF THE INVENTION

For portable communication devices, such as radiotelephones, it is desirable to minimize the size of the radiotelephone (for portability and ease of handling) and to reduce power consumption. One way to reduce size and power consumption is through the use of bit-serial digital processing, wherein parallel arithmetic is transformed to serial arithmetic. The use of bit-serial processing reduces the gate count, silicon area, and current drain of integrated circuits when compared to parallel-formatted digital circuits. Bit-serial processing is generally accomplished through the use of three basic building blocks: a bit-serial adder, a bit-serial scaler, and a bit-serial delay element.

A conventional parallel adder has two parallel inputs and an output. For example, a conventional sixteen-bit parallel adder has two sixteen-bit parallel inputs and a sixteen-bit output, and it may be built with sixteen full adders. In contrast to a conventional parallel adder, a bit-serial adder consists of two one-bit inputs and a one-bit output. To achieve a dynamic range equivalent to that of a parallel adder, the clock rate of the bit-serial adder must be increased by a factor corresponding to the number of bits in the digital word. The following equation can be used to characterize the required increased clock rate for a bit-serial adder:

$$f_{bit} = B * f_{sample}$$

where $f_{bit}$ is the bit-serial adder clock rate, B is the number of bits in the digital word, and $f_{sample}$ is the digital word sampling rate. Each bit in a word, from the least significant bit (LSB) to the most significant bit (MSB), appears on the serial bus for one bit time period ($1/f_{bit}$).

Bit-serial scaling is a form of digital multiplication wherein a digital word is scaled by a factor of $2^{-N}$. Bit-serial scaling is achieved by first producing versions of a digital word wherein the bits are shifted by N bits. The bit-shifted versions of the input word are summed to produce the digital word multiplied by a selected coefficient.

Bit-serial delays are generally implemented using a shift register. The shift register holds a bit for a predetermined number of bit time periods using flip-flops.

In many systems there are digital signals that operate at different sampling rates. In order to perform the necessary digital arithmetic, the sampling rates of all of the signals must be identical. Therefore, it is often necessary to increase the sampling rate of a digital signal by an integer factor M>1. This is commonly referred to as interpolation.

The sampling rate increase may also be needed to achieve a finer resolution of received digital signals. This finer resolution is necessary, for example, to obtain a better frequency estimate of an incoming received digital signal. The zero-crossings of the signal can be used for the frequency estimation, and interpolation provides a more accurate estimation of the zero-crossings.

One approach used to achieve interpolation is by linearly interpolating (M-1) values between samples of the digital signal. For example, consider a sampling rate increase factor of M=4. If two successive samples, at the pre-interpolated sampling rate, are x(n)=1 and x(n+1)=5, then a linear interpolation would result in the following sequence: y={1, 2,3,4,5}. One method to accomplish this mathematical computation would be a direct, brute-force mathematical computation through the use of a DSP.

Another approach to sampling rate increase is through the use of "zero-stuff" interpolation. Zero-stuff interpolating involves inserting (M-1) "zeroes" between existing data values of the input sequence x. Further processing of the zero-stuffed signal may be required, depending upon system requirements.

If further processing is required, the zero-stuffed sequence is then generally filtered. In addition, it is sometimes necessary to produce a sliced output representation of the zero-stuffed, interpolated signal. For example, if the frequency or phase of the interpolated signal is all that is desired, the zero crossings may be sufficient to provide this information.

A linear interpolator with a sliced output involves looking at a sign bit of the interpolated signal and then outputting a value depending upon the sign bit. For example, if successive samples, at the interpolated sampling rate are x(n)=−0.25 and x(n+1)=0.15, then a linear interpolation would result in the following sequence: y={−0.25, −0.15, −0.05, 0.05, 0.15}. If the digital system is defined such that asserted high corresponds to a negative number in the sequence and an asserted low corresponds to a positive number in the sequence, then the sliced output would be $Y_{sliced}$=11100.

Filtering and slicing can be achieved through the use of a Finite Impulse Response (FIR) filter. However, for portable applications, such as portable communication devices, the direct implementation of an FIR filter can be hardware intensive and would thus consume too much space and power. The added space will thus increase the size of the portable communication device and the additional power required would reduce battery life.

Accordingly, when a system is based on a bit-serial architecture and an interpolated signal with a sliced output is desired, there is a need for a bit-serial architecture that does not require a complete FIR filter implementation.

DETAILED DESCRIPTION OF A PREFERRED EMBODIMENT

Delayed versions of a bit-serial input sequence are created. When the interpolation involves scaled versions of the input sequence, scaled versions of the input sequence are produced. The interpolation equations are implemented by adding the delayed versions of the input sequence and the scaled versions of the input sequence together. The sign bit of each of the equated interpolation terms are applied to a multiplexer, and the sign bits are sequentially produced at the multiplexer output as a multiplexed signal. The multiplexed sign bits are sequentially latched to the output of a latch to produce the bit-serial interpolation with sliced output signal.

Figure 1:
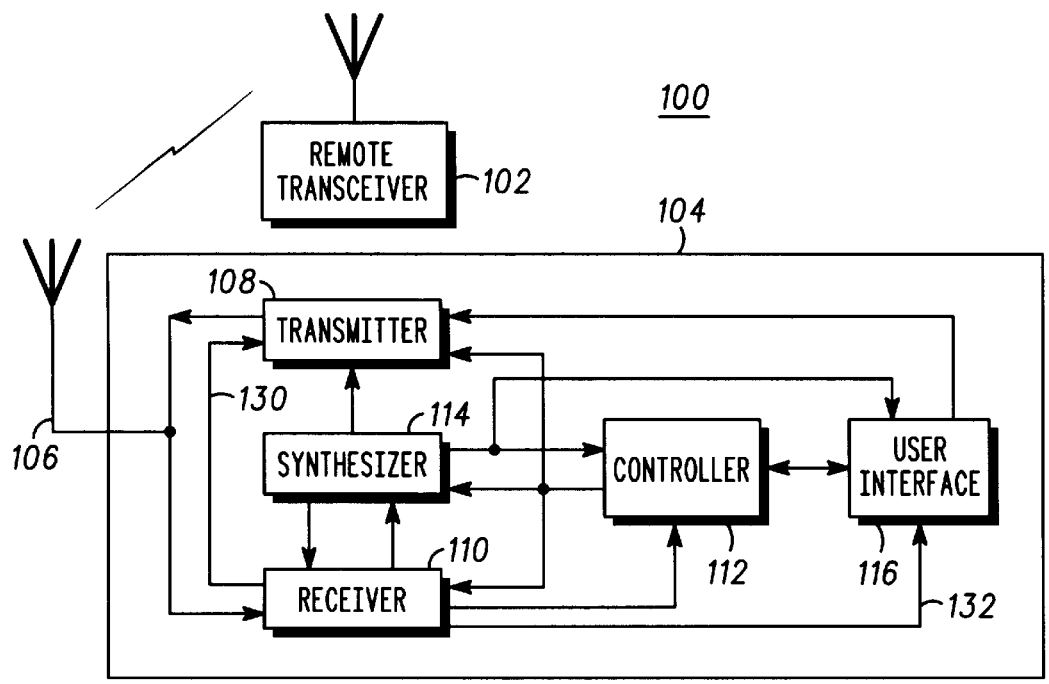
FIG. 1 is a block diagram of a radiotelephone communication system which may employ a linear interpolator with sliced output.

FIG. 1 is an illustration in block diagram form of a radiotelephone communication system 100. The radiotelephone communication system 100 includes a remote transceiver 102 and one or more radiotelephones such as radiotelephone 104. The remote transceiver 102 sends and receives RF signals to and from radiotelephones within a fixed geographic area. The radiotelephone 104 is one such radiotelephone contained within the geographic area and includes an antenna 106, a transmitter 108, a receiver 110, a controller 112, a synthesizer 114, and a user interface 116.

To transmit RF signals containing transmit data (such as voice, digital information, or control signals) from the radiotelephone 104 to the remote transceiver 102, the user interface 116 directs user input data to the controller 112. The controller 112 typically includes a microprocessor, memory, a clock generator, and a power amplifier control circuit. The controller 112 formats the transmit data obtained from the user interface 116 and conveys it to the transmitter 108 for conversion into RF modulated signals. The transmitter 108 conveys the RF modulated signals to the antenna 106 for transmission to the remote transceiver 102.

The radiotelephone 104 detects RF signals containing receive data through the antenna 106 and produces detected RF signals. The receiver 110, coupled to the antenna 106, converts the detected RF signals into electrical baseband signals, demodulates the electrical baseband signals, recovers the receive data, including automatic frequency control information, and outputs the receive data to the controller 112. The controller 112 formats the data into recognizable voice or data information for use by user interface 116. The user interface 116 communicates the received information or voice to a user. Typically, the user interface 116 includes a microphone, a speaker, a display, and a keypad. The receiver 110 also receives a Supervisory Audio Tone (SAT) signal from the remote transceiver 102, filters and processes the SAT signal, and relays the SAT signal to the transmitter 108 for transmission back to the remote transceiver.

The synthesizer 114 generates RF signals for use by the receiver 110 and the transmitter 108 to allow the reception and transmission of data. Control over functions of the transceiver, such as channel of operation frequency, is provided by the controller 112, and is applied, in part, to the synthesizer 114 as synthesizer program instructions. A high speed data processing section within the receiver 110 recovers high speed data containing the control-type signals (such as channel of operation) and directs the information to the controller 112.

Figure 2:
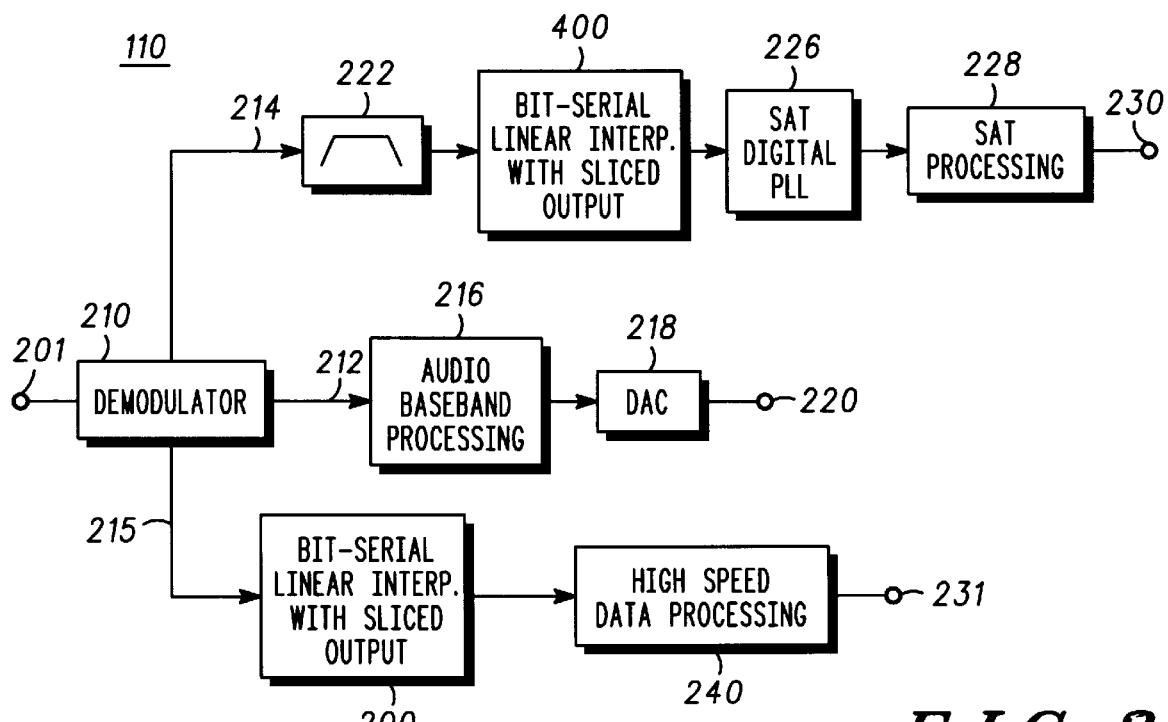
FIG. 2 is a block diagram of a radiotelephone receiver employing a linear interpolator with sliced output in accordance with the present invention.

A basic block diagram of the receiver 110 employing the bit-serial linear interpolator with sliced output is generally shown in FIG. 2. Although the illustrated embodiment of the radiotelephone 104 has a transmitter 108 and a receiver 110, the bit-serial linear interpolator with sliced output can be used in any device requiring bit-serial linear interpolation with sliced output. For example, the bit-serial linear interpolator with sliced output can be employed in a MODEM (modulator/demodulator), two-way radios, land-line telephones, recording instruments, cellular telephones, cordless telephones, and radio frequency transmitters and receivers.

The signal received at antenna 106 (FIG. 1) is applied to input port 201 and coupled to the conventional demodulator 210. The conventional demodulator 210 is generally for filtering, signal amplification and gain control, frequency downconversion, and information signal recovery. The demodulator 210 produces a demodulated signal, and a first portion of the demodulated signal is coupled through line 212 to an audio and baseband processing block 216. The audio and baseband processing block 216 is for further processing of the demodulated signal, and it generally performs radio receiver functions such as filtering, gain amplification and gain control, signal level detection, deemphasis, and expansion. The processed signal produced by the audio and baseband processing block 216 is coupled to a digital to analog converter 218 where it is converted to an analog signal that appears at output 220 for application to the controller 112 (FIG. 1) and the user interface 116 (FIG. 1).

A second portion of the demodulated signal is coupled through line 214 to a bandpass filter 222. In the illustrated embodiment, the bandpass filter comprises a bit-serial bandpass filter that is known to those skilled in the art. The bandpass filter 222 is for filtering the received signal for recovery of the SAT signal. The bandpass signal is thus centered at substantially six KHz. The filtered signal is coupled to the bit-serial linear interpolator with sliced output 400. In the illustrated embodiment, the bit-serial linear interpolator is for improving the detection and locking to the SAT signal by increasing the time resolution of the zero crossings. A detailed description of the bit-serial linear interpolator with sliced output 400, as well as other embodiments, will be described in detail in FIGS. three through six.

The sliced signal is applied to the conventional digital phase-locked loop 226 for locking to the sliced SAT signal. The output of the digital phase-locked loop 226 is coupled to the SAT processing block 228. The SAT processing block 228 is for performing conventional processing functions such as downsampling, filtering to restore the sinusoidal shape of the SAT signal, and signal amplification to produce the recovered SAT signal at output 230. The recovered SAT signal is then coupled, through line 130 of FIG. 1, to the transmitter 108 for transmission back to the remote transceiver 102.

A third portion of the demodulated signal is coupled through line 215 to a bit-serial linear interpolator with sliced output 200. The signal produced by the bit-serial linear interpolator with sliced output 200 is coupled to a high speed data processing block 240 for recovery of high speed data. The high speed data processing block 240 generally comprises a digital phase locked loop for synchronization to the data signal, data detect circuitry for detecting the data, error correction circuitry, and interface circuitry for interfacing to the controller 112. The high speed data produced at output 231 is then directed to the controller 112 (FIG. 1). A detailed description of the bit-serial linear interpolator with sliced output 200, as well as other embodiments, will be described in detail in FIGS. three through six.

Figure 3:
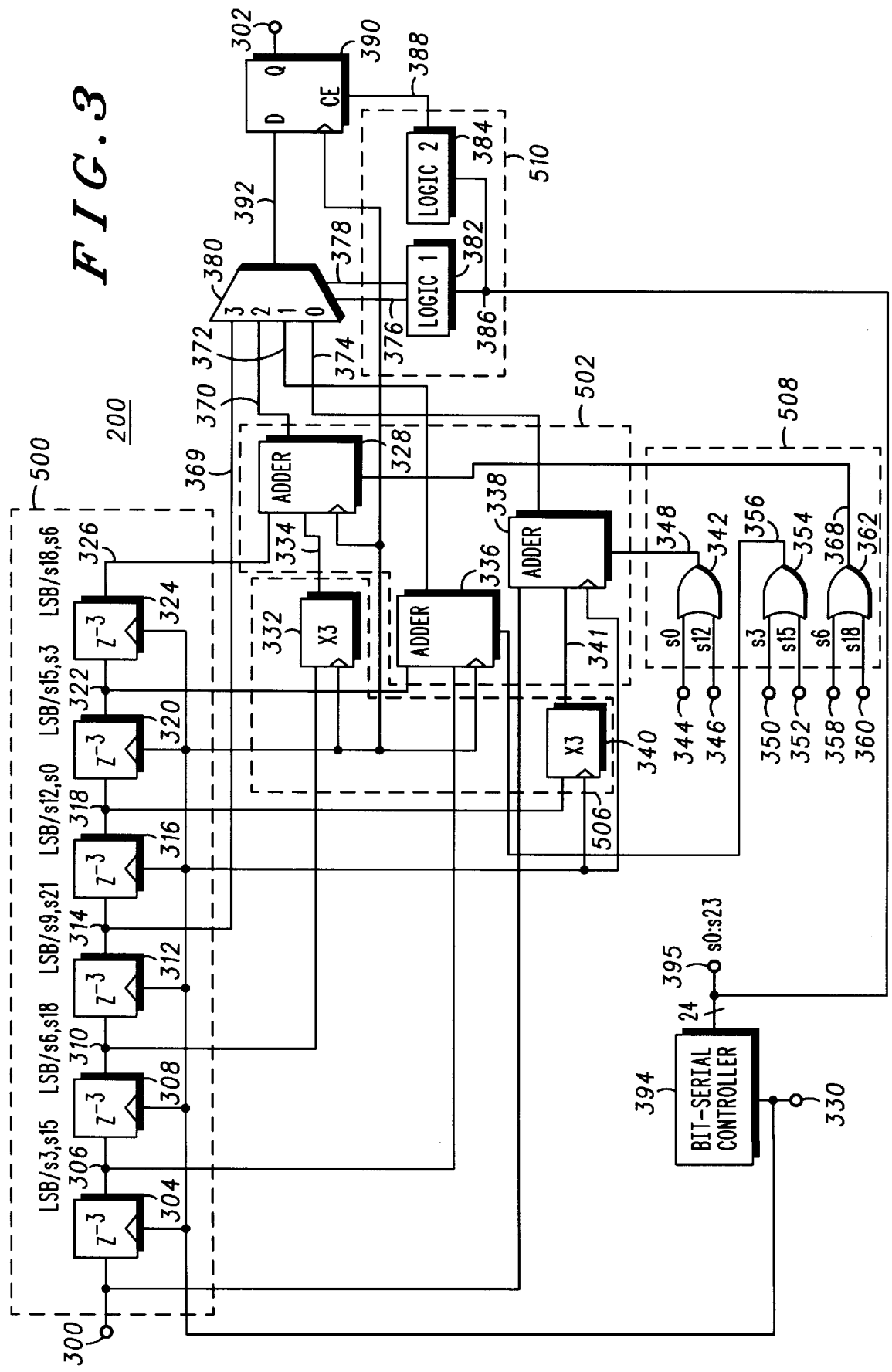
FIG. 3 is a block diagram of a bit-serial linear interpolator with sliced output for a times-four interpolation factor and a twelve-bit bit-serial word input in accordance with the present invention.

FIG. 3 is a block diagram of a bit-serial linear interpolator with sliced output 200 that has a times-four interpolation factor and a twelve-bit bit-serial word input. This specific embodiment is used to exemplify how the bit-serial linear interpolator with sliced output can be implemented for a specific word length and interpolation factor. It will be recognized by those skilled in the art that in order to obtain other interpolation factors and to operate on words of different bit lengths, other embodiments of the bit-serial linear interpolator with sliced output can be used without the use of the inventive faculty.

Each twelve-bit digital word has the format s.ssXXXXXXXXX, wherein the first "s" represents the sign bit, and the second two "s's" are sign extensions. Based on an example input pattern of {a, b, c, ... }, the resultant linear interpolation sequence is descried by {a, (3a/4+b/4), (a/2+b/2), (a/4+3b/4), b, (3b/4+c/4), (b/2+c/2), (b/4+3c/4), c, ... }. Since the output is sliced (e.g. the sign bit of each word is all that is required), the scaling factors have no impact upon the final result. Therefore, the scaling factors of ¼ and ½ can be removed. The actual unsliced linearly interpolated pattern is then {a, 3a+b, a+b, a+3b, b, 3b+c, b+c, b+3c, c, ... }.

Adder circuitry is thus necessary to generate the 3a+b, a+b, and a+3b terms. In the given nomenclature, "a" represents a twelve-bit, bit-serial digital word that occurs prior in time to "b". Thus, the first interpolated term between to twelve-bit words of a sequence comprises scaling (multiplying) the first word "a" by three and adding that directly to the second digital word "b." Since this is a bit-serial architecture, the scaling of each word is performed beginning with the least significant bit (LSB) of each word. Thus, the bits of each word are processed sequentially.

The bit-serial linear interpolator with sliced output 200 is controlled by a twenty-four-bit bit-serial controller 394. In the illustrated embodiment, the bit serial controller 394 comprises a shift register having the last register output coupled to the first register input. In addition, the bit-serial controller 394 has an output 395 comprising multiple output lines such that an asserted high signal is sequentially shifted from the first output line to the last output line one bit-period at a time. The signal appearing on each output line thus represents a separate control signal. A bit-serial clock signal is applied to input 330 to drive the bit-serial controller 394 for producing the multiple control signals on the multiple output lines.

The output 395 of the bit-serial controller 394 comprises 24 separate output lines, and an asserted high bit is shifted sequentially from the first output line, designated s0, to the last output line, designated s23, one bit period at a time. Thus, at the first bit period s0 of the bit-serial clock signal, line s0 of the output 395 is asserted high. Upon the next bit period of the clock signal, s0 is asserted low and line s1 of output 395 is asserted high. The asserted high signal is sequentially shifted through each output line and then is repeated starting at line s0 of output 395.

In the illustrated embodiment, the bit-serial controller 394 comprises a twenty-four-bit bit-serial controller. This is to reuse a bit-serial controller that is already used in another part of the radiotelephone 104. In alternate embodiments, a twelve-bit controller can be used to achieve a linear interpolation by four with a sliced output for a twelve-bit bit-serial word.

The twelve-bit words of the sequence are applied to input 300. The input 300 couples each twelve-bit word to delay circuitry 500. The delay circuitry 500 comprises series connected delay elements. For example, in the illustrated embodiment, the input 300 is coupled to delay element 304 to produce at delay output 306 a version of the input word that is delayed for three bit periods. Delay output 306 is coupled to delay element 308 to produce at delay output 310 a version of the input word that is delayed for six bit periods. Delay output 310 is coupled to delay element 312 to produce at delay output 314 a version of the input word that is delayed for nine bit periods. Delay output 314 is coupled to delay element 316 to produce at delay output 318 a version of the input word that is delayed for twelve bit periods. Delay output 318 is coupled to delay element 320 to produce at delay output 322 a version of the input word that is delayed for fifteen bit periods. Delay output 322 is coupled to delay element 324 to produce at delay output 326 a version of the input word that is delayed by eighteen bit periods.

The nomenclature above each delay output of the delay circuitry 500 is to help track the progression of the LSB for two successive twelve bit words of the sequence. For example, at the input 300, the LSB for the first word arrives at time s0. This also corresponds to the time that line s0 of output 395 for the bit-serial controller 394 is asserted high. Since the input words are twelve bits long, the LSB for the next word of the sequence arrives at input 300 at time s12, since s12 corresponds to twelve bit-periods later than s0. Likewise, s12 corresponds to when line s12 of output 395 of the bit-serial controller 394 is asserted high.

Since delay element 304 delays its input for three bit periods, the LSB of the first word arrives at delay output 306 at time s3, and the LSB of the second word arrives twelve bit periods later at time s15. The LSB of the first word arrives at delay output 310 at time s6, and the LSB of the second word arrives at delay output 310 at time s18. This nomenclature is followed through to delay output 326.

Adder circuitry 502 and scaling circuitry 506 are for implementing the interpolation equations necessary for linear interpolation with M=4. For example, the first interpolation term that must be generated is {3a+b}. The LSB of the second word, b, first appears at the input 300 at time s12. Therefore, input 300 is coupled to a first bit-serial adder 338. At time s12, the LSB of the first word, a, appears at delay output 318, so delay output 318 is coupled to a first bit-serial scaler 340. The bit-serial clock signal appearing at input 330 is applied to the first bit-serial scaler 340 and the first bit-serial adder 338 to synchronize them to the bit-serial controller 394. The first bit-serial scaler 340 produces at output 341 a version of the LSB of the first input word, a, that is scaled by three. The output 341 of the first bit-serial scaler 340 is coupled to the first bit-serial adder 338.

The first bit-serial adder 338 must produce the first term of the interpolation sequence at specific times. For example, addition by the first bit-serial adder 338 must be initiated at time s12. Time s12 corresponds to when the LSB of the input words appear at the first bit-serial adder 338 inputs. The addition is then performed bit-by-bit. Since the bit-serial controller 394 in the illustrated embodiment comprises a twenty-four bit controller, whereas the input words are twelve-bits in length, the next addition must be initiated at the time s0. Therefore, line s0 of the output 395 for the bit-serial controller 394 is coupled to the first input 344 of a first OR gate 342, and line s12 of the output 395 for the bit-serial controller 394 is coupled to the second input 346 of a first OR gate 342.

The output 348 of the first OR gate 342 is asserted high at times corresponding to s12 and s0 and is used to control the first bit-serial adder 338. This ensures that the addition for the first interpolation term of the sequence is performed at the correct times. The addition term produced by the first bit-serial adder 338 is applied to a first input 374 of a multiplexer 380.

The second interpolation term that must be generated is {a+b}. The LSB of the second word, b, appears (after the first interpolation term has been produced) at the delay output 306 at time s15. Therefore, delay output 306 is coupled to a second bit-serial adder 336. At time s15, the LSB of the first word, a, appears at delay output 322, so delay output 322 is coupled to the second bit-serial adder 336. The bit-serial clock signal appearing at input 330 is applied to the second bit-serial adder 336 to synchronize the second bit-serial adder 336 to the bit-serial controller 394.

The second bit-serial adder 336 must produce the second term of the interpolation sequence at specific times. For example, the addition of the LSB of the first two terms, a and b respectively, must be performed at time s15. Since the bit-serial controller 394 in the illustrated embodiment comprises a twenty-four bit controller, the next addition must be performed at time s3. Therefore, line s15 of the output 395 of the bit-serial controller 394 is coupled to the first input 352 of a second OR gate 354, and line s3 of the output 395 of the bit-serial controller 394 is coupled to the second input 350 of the second OR gate 354.

The output 356 of the second OR gate 354 is asserted high at times corresponding to s15 and s3 to control the second bit-serial adder 336. This ensures that the addition for the second interpolation term of the sequence is performed at the correct times. The addition term produced by the second bit-serial adder 336 is applied to a second input 372 of the multiplexer 380.

The third interpolation term that must be generated is {a+3b}. The LSB of the second word, b, appears (after the second interpolation term has been produced) at the delay output 310 at time s18. Therefore, delay output 310 is coupled to a second bit-serial scaler 332. The bit-serial clock signal appearing at input 330 is applied to the second bit-serial scaler 332 and the third bit-serial adder 328 to synchronize them to the bit-serial controller 394. The second bit-serial scaler 332 produces at output 334 a version of the second input word, b, that is scaled by three. The output 334 of the second bit-serial scaler 332 is coupled to the third bit-serial adder 328. Similarly, at time s18, the LSB of the first word, a, appears at delay output 326, so delay output 326 is coupled to the third bit-serial adder 328.

The third bit-serial adder 328 must produce the third term of the interpolation sequence at specific times. For example, the addition of the LSB of the first two terms, a and b respectively, must be performed at time s18 Since the bit-serial controller 394 in the illustrated embodiment comprises a twenty-four bit controller, the next addition must be performed at time s6. Therefore, line s18 of the output 395 of the bit-serial controller 394 is coupled to the first input 360 of a third OR gate 362, and line s6 of the output 395 of the bit-serial controller 394 is coupled to the second input 358 of the third OR gate 362.

The output 368 of the third OR gate 362 is asserted high at times corresponding to s18 and s6 to control the third bit-serial adder 328. This ensures that the addition for the third interpolation term of the sequence is performed at the correct times. The addition term produced by the third bit-serial adder 328 is applied to a third input 370 of the multiplexer 380.

First OR gate 342, second OR gate 354, and third OR gate 362 thus collectively make up what is termed adder control circuitry 508. Adder control circuitry 508 produces the control signals, also referred to as adder circuitry control signals, that are necessary to ensure that the adder circuitry 502 generates the interpolation terms at the correct times.

The term that follows the three generated interpolation terms (between a and b) is the b word itself. The word b first appears (after the third interpolation term is generated) at time s21. Therefore, delay output 314 is coupled to the fourth input 369 of the multiplexer 380.

The sequence of events described for the generation of the interpolation terms of the sequence for the LSB is also performed for every other bit of each twelve-bit word. However, for the sliced output of the linear interpolation, only the sign bit, which here is also the most significant bit (MSB), is required at the final output 302. Therefore, since the first interpolation term, 3a+b, is produced at time s12, the sign bit for this term occurs eleven bits later at time s23. Likewise, the sign bit for 3b+c occurs at time s11. Therefore, the first input 374 to the multiplexer 380 must appear at the multiplexer output 392 at times corresponding to s23 and s11.

Since the second interpolation term, a+b, is produced at time s15, the sign bit for this term occurs eleven bits later at time s2. Likewise, the sign bit for b+c occurs at time s14. Therefore, the second input 372 to the multiplexer 380 must appear at the multiplexer output 392 at times corresponding to s2 and s14.

Since the third interpolation term, a+3b, is produced at time s18, the sign bit for this term occurs eleven bits later at time s5. Likewise, the sign bit for b+3c occurs at time s17. Therefore, the third input 370 to the multiplexer 380 must appear at the multiplexer output 392 at times s5 and s17.

The next term in the sequence, after the three interpolation terms are produced after word a, is b. The b term appears at time s21, and the sign bit of b appears at time s8. Likewise, the sign bit for c occurs at time s20. Therefore, the fourth input 369 to the multiplexer 380 must appear at the multiplexer output 392 at times s8 and s20.

The sign bit for each word is only valid for one bit-time, $f_{bit}$. Therefore, the multiplexer 380 is switched at the arrival of each valid MSB. That MSB value is then latched to the final output 302 by the latch 390 for three bit-times. In the illustrated embodiment, the latch 302 comprises a D flip-flop. Multiplexer and latch logic 510, also generally referred to as logic circuitry is used to sequentially switch the multiplexer 380 and latch the terms appearing at the multiplexer output 392 to the final output 302 for three bit-periods.

Multiplexer and latch logic 510 comprises a first combinational logic 382 and a second combinational logic 384. The control signals produced on lines s0 through s23 of the bit-serial controller output 395 are applied to the first combinational logic 382 and the second combinational logic 384 through input 386.

The first combinational logic 382 has a first control line 376 and a second control line 378 that are coupled to the multiplexer 380. These two control lines carry the four two-bit control words necessary to switch the multiplexer 380. The first control line 376 carries the MSB of the two-bit control word, and the second control line 378 carries the LSB of the two-bit control word. The equations describing the MSB and the LSB of the two-bit control word are:

$$MSB = (s5+s6+s7)+(s8+s9+s10)+(s17+s18+s19)+(s20+s21+s22) \quad (1)$$

$$LSB = (s2+s3+s4)+(s8+s9+s10)+(s14+s15+s16)+(s20+s21+s22) \quad (2)$$

For example, the sign bit for the first interpolation term, appearing at first input 374 of the multiplexer 380, occurs at times s23 and s11. The two bit control word necessary to switch to the first input 374 is 00. Neither control line s23 or s11 appear in the MSB and LSB equations, indicating that both are equal to zero at times s23 and s11. Therefore, at those times the term appearing on first input 374 will be switched to the multiplexer output.

The sign bit for the second interpolation term, appearing on second input 372 of the multiplexer 380, occurs at times s2 and s14. The two bit control word necessary to switch the second input 372 to the multiplexer output 392 is 01. Since s2 appears in the LSB equation but not the MSB equation, at time s2 the two-bit control line is 01. Since the sign bit for the next term in the sequence always occurs three bit-times later, the multiplexer 380 is held for three bit times. Therefore s3 and s4 also produce a control word of 01. Likewise, the sign bit for the second interpolation term occurs at time s14. Therefore, lines s14, s15, and s16 appear in LSB equation but not the MSB equation.

The sign bit for the third interpolation term, appearing on third input 370 of the multiplexer 380, occurs at times s5 and s17. The two-bit control word necessary to switch the third input 370 to the multiplexer output 392 is 10. Control lines s5, s6, and s7 appear in the MSB equation but not the LSB equation in order to switch the multiplexer 380 to the third input 370 for three bit-times. Likewise, Control lines s17, s18, and s19 appear in the MSB equation but not the LSB equation in order to switch the multiplexer 380 to the third input 370 for three bit-times.

The sign bit for the next term in the sequence, appearing on fourth input 369 of the multiplexer 380, occurs at times s8 and s20. The two-bit control word necessary to switch the fourth input 369 to the multiplexer output 392 is 11. Control lines s8, s9, and s10 appear in the MSB equation and the LSB equation in order to switch the multiplexer 380 to the fourth input 369 for three bit-times. Likewise, Control lines s20, s21, and s22 appear in the MSB equation and the LSB equation in order to switch the multiplexer 380 to the fourth input 369 for three bit-times.

The second combinational logic 384 has a control line 388 that is coupled to the latch 390. Control line 388 controls the latch 390 so that it latches the multiplexed terms for three bit-times. The equation describing the one-bit control word is:

$$bit = (s2 + s5 + s8 + s11 + s14 + s17 + s20 + s23) \quad (3)$$

Thus, the multiplexed terms will be latched to the final output 302 at the times given in equation three.

The operation of the bit-serial linear interpolator with sliced output 200 can be described by the following equation:

$$N/M = S \quad (4)$$

In equation four, N is the input bit-width, M is the interpolation factor, and S is the valid duration of the sign bit, which is an integer. For example, for M=4 and N=12, the valid duration of the sign bit is thus $3 * f_{bit}$, or S=3. The generalization of equation four is contingent upon having sufficient quantization to represent all intermediate terms and sufficient time to perform all multiplications necessary for intermediate scaling.

Figure 4:
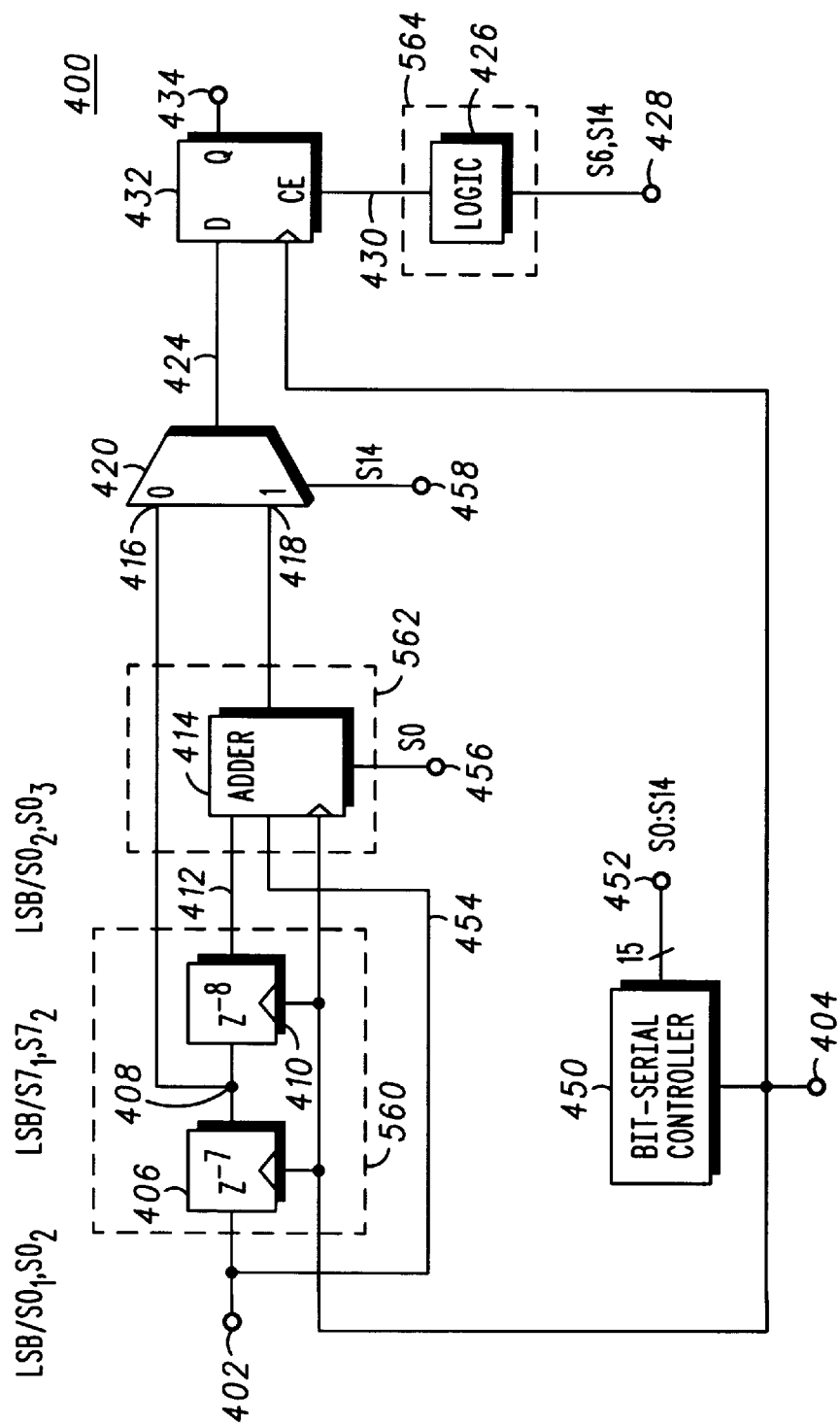
FIG. 4 is a block diagram of a bit-serial linear interpolator with sliced output for a times-two interpolation factor and a fifteen-bit bit-serial word input in accordance with the present invention.

If N/M is not an integer, the methodology described by the architecture of FIG. 3 can be used if some timing error in the interpolation is acceptable. For example, FIG. 4 is a block diagram of a bit-serial linear interpolator with sliced output 400 for an approximate times-two interpolation factor and a fifteen-bit bit-serial word input (N/M=7.5). This embodiment can be used, for example, to convert a data stream operating at 128 Ksamples/sec to 256 Ksamples/sec with a sliced output (N/M=7.5).

The linear interpolator with sliced output 400 is controlled by a fifteen-bit bit-serial controller 450. A bit-serial clock signal is applied to input 404 to drive the bit-serial controller 450. The bit serial controller 450 comprises a shift register having the last register output coupled to the first register input. In addition, the output of the bit serial controller 450 comprises fifteen separate output lines, each coupled to one of the registers. An asserted high bit is shifted sequentially from the first output line, designated s0, to the last output line, s14, one bit period at a time. The bit-serial clock signal appearing at input 404 is also applied to delay element 406, delay element 410, bit-serial adder 414, and latch 432 for synchronization to the bit-serial controller 450.

Each fifteen-bit digital word has the format s.ssXXXXXXXXXXXX, wherein the first "s" represents the sign bit, and the second two "s's" are sign extensions. Based on an example input pattern of {a, b, c, . . . }, the resultant linear interpolation sequence is described by {a, (a/2+b/2), b, (b/2+c/2), c, . . . }. Since the output is sliced, the scaling factor of ½ can be removed. The unsliced linearly interpolated pattern is then {a, a+b, b, b+c, c, . . . }.

The fifteen-bit words of the sequence are applied to input 402. The input 402 couples each fifteen-bit word to delay circuitry 560. The delay circuitry 560 comprises series connected delay elements. Thus, the input 402 is coupled to delay element 406 to produce at delay output 408 a version of the input word that is delayed for seven bit periods. Delay output 408 is coupled to delay element 410 to produce at delay output 412 a version of the input word that is delayed for fifteen bit periods.

The LSB of the first word of the sequence, a, arrives at the input 402 at time $s0_1$. The subscript 1 denotes a first fifteen-bit cycle of the fifteen-bit bit-serial controller 450. For example, when the last output line of the fifteen bit output 452, designated s14, is asserted high on the fifteenth bit-period of the clock signal, the first output line of the output 452, designated s0, will become asserted high at $s0_2$ of the next fifteen-bit clock cycle.

Since delay element 406 delays its input for seven bit periods, the LSB of the first word of the sequence, a, arrives at delay output 408 at time $s7_1$. The LSB of the first word, a, arrives at delay output 412 eight bit-periods later at time $s0_2$. In addition, LSB of the second word of the sequence, b, arrives at input 402 at time $s0_2$. Likewise, the LSB of the third word of the input sequence, c, arrives at input 402 at time $s0_3$.

Adder circuitry 562 is for implementing the interpolation equation necessary for linear interpolation with M=2. For example, to generate the interpolation term of a+b, the LSB of the second word, b, of the uninterpolated input sequence first appears at the input 402 at time $s0_2$. Therefore, input 402 is coupled through line 454 to bit-serial adder 414. At time $s0_2$, the LSB of the first word, a, appears at delay output 412; delay output 412 is thus coupled to the bit-serial adder 414. The bit-serial adder control port 456 is coupled to the s0 output line of the bit-serial controller 450 so that the bit-serial adder 414 resets and begins adding bits of the input sequence and delayed versions of the input sequence every s0 bit-period of the fifteen bit cycle of the bit-serial controller 450.

The interpolation term appearing at the output of the bit-serial adder 414 is applied to a second input 418 of a multiplexer 420. After the interpolation term of {a+b}, the b term itself comes next in the interpolated sequence. After the {a+b} term is generated by the bit-serial adder 414 at time $s0_2$, the b term is present at delay output 408 at time $s7_2$. Therefore, delay output 408 is coupled to a first input 416 of multiplexer 420. For the sliced output, only the sign bit (e.g. the MSB) is required at the final output 434.

The initiation of the addition for the interpolation term a+b occurs at every s0 period of the fifteen-bit cycle of the bit-serial controller, so the sign bit for the term occurs at time s14. Therefore, the s14 output line of the bit-serial controller output 452 is applied to input 458 as a control signal for the multiplexer 420. The output line s14 is asserted high at time s14 and will direct the sign bit to multiplexer output 424. At all other times of the fifteen-bit cycle, the signal appearing at input 416 of the multiplexer 420 will be switched to the multiplexer output 424. The latch 432 is then used to latch the sign bit of the words, appearing at inputs 416 and 418, to the final output 434.

To latch the sign bit to the final output, output lines s6 and s14 of the bit-serial controller output 452 are applied to an input 428 of the multiplexer and latch logic 564. The multiplexer and latch logic 564, also referred to as logic circuitry, comprises combinational logic 426 for controlling the latch 432. The sign bit of the a+b term is latched to the final output 434 by output line s14 of the bit-serial controller output 452. In addition, since the LSB of the terms appearing at input 416 occurs at time s7 of the fifteen-bit cycle, the sign bit for the terms appear at the input 416 fourteen bit periods later at time s6 of the next bit-serial controller 450 cycle. Therefore, the sign bit of the terms appearing at input 416 are latched to the final output 434 by output line s6 of the bit-serial controller output 452.

The terms appearing at the output 434 are switched between the sign of a first term for eight bit-periods and the sign of the interpolation term, a+b, for seven bit-periods. Ideally, the time duration for each term appearing at the final output 434 should be 7.5 bit-periods. In certain applications, however, such as interpolation of a six KHz advanced mobile phone system (AMPS) supervisory audio tone (SAT), the timing bias of eight bit-periods followed by seven bit-periods is not detrimental to system performance.

Figure 5:
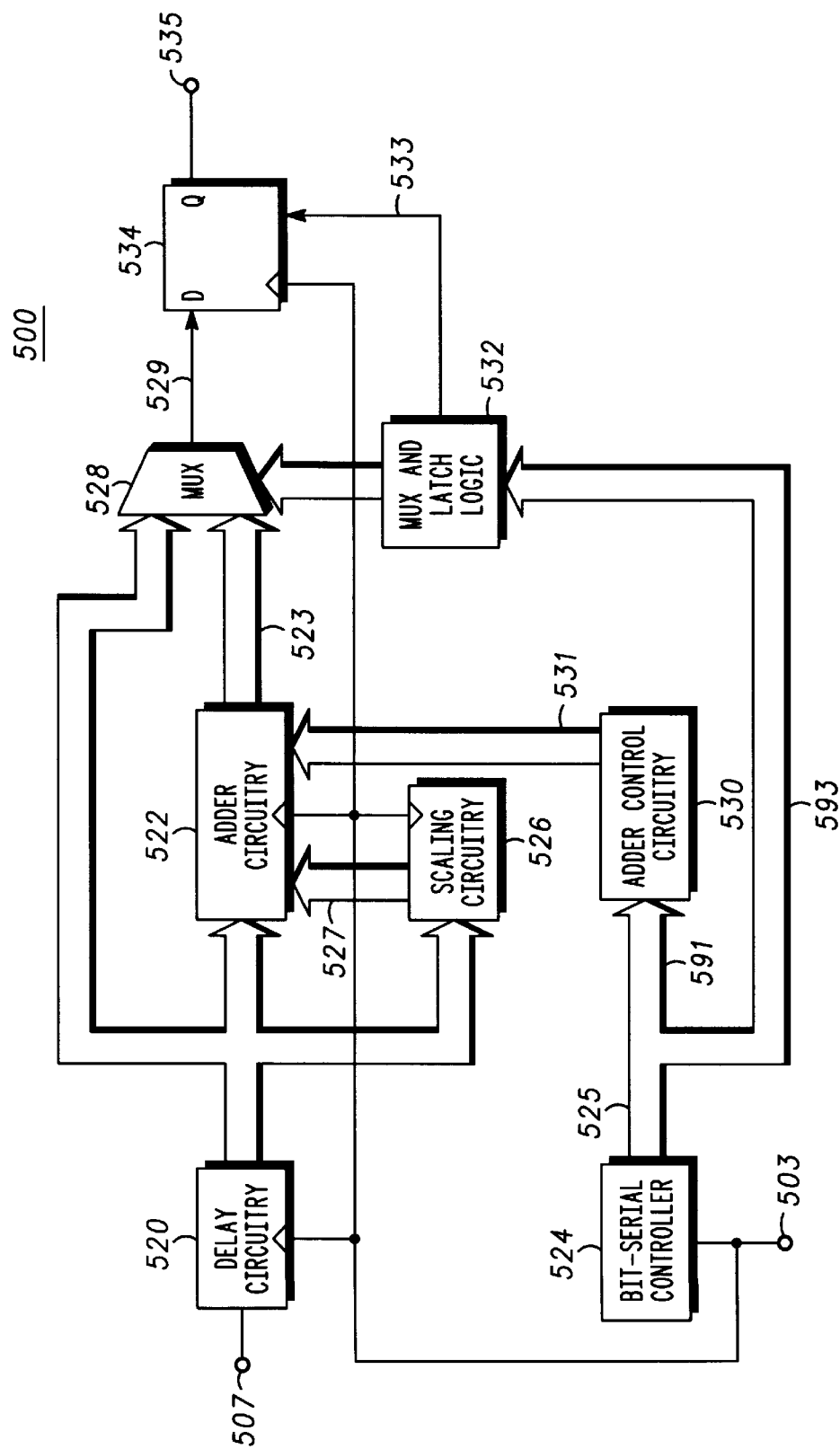
FIG. 5 is a block diagram illustrating a generalized representation of a bit-serial architecture used for a linear interpolation and slice operation in accordance with the present invention.

FIG. 5 is a block diagram illustrating a bit-serial linear interpolator with sliced output 500 for an input word length of N and an interpolation factor of M. The bit-serial linear interpolator with sliced output 500 is controlled by a bit-serial controller 524. This bit-serial controller 524 can be one that is also used for other functions within a specific system, or it can be a controller dedicated to the bit-serial controller with sliced output 500. The bit serial controller 524 comprises a shift register having the last register output coupled to the first register input. In addition, the bit-serial controller 524 has a controller output 525 comprising multiple output lines such that an asserted high signal is sequentially shifted from the first output line to the last output line one bit-period at a time.

A clock signal is applied to input 503 to drive the bit-serial controller 524. The clock signal is also applied to delay circuitry 520, adder circuitry 522, scaling circuitry 526, and latch 534 for synchronization to the bit-serial controller 450.

The delay circuitry 520, adder circuitry 522, and scaling circuitry 526 are for implementing the interpolation equations necessary for linear interpolation. The N-bit length input sequence is applied to input 507 and coupled to delay circuitry 520. The delay circuitry 520 comprises series connected delay elements with multiple tap points for producing delayed versions of the input sequence. The multiple tap points are for accessing the input sequence and delayed versions of the input sequence and coupling the input sequence and the delayed versions of the input sequence to the adder circuitry 522, the scaling circuitry 526, and the multiplexer 528.

The adder circuitry 522 uses the input sequence and delayed versions of the input sequence to produce the addition terms necessary for the interpolated sequence. The adder circuitry 522 comprises at least one bit-serial adder for producing the addition terms at the adder circuitry output 523. The adder circuitry output 523 thus comprises a separate output line for each bitserial adder of a particular implementation. For example, for an interpolation factor of M=2, adder circuitry 522 comprises one bit-serial adder and the adder circuitry output 523 thus comprises a single output line. For an interpolation factor of M=4, adder circuitry 522 comprises three bit-serial adders and the adder circuitry output 523 comprises three output lines.

The adder control circuitry 530 is for controlling the adder circuitry 522. The adder control circuitry generally comprises simple combinational logic. The adder control circuitry output 531 can comprise a single output line when the control of only one bit-serial adder is necessary. When the adder circuitry 522 comprises multiple bit-serial adders, the adder control circuitry output comprises a separate output line for each of the bit-serial adders.

The adder control circuitry 530 is driven by a first portion of the multiple control signals produced by the bit-serial controller 524. The controller output 525 comprises multiple output lines that are equal in number to the bit-length of the bit-serial controller 524. For example, for a fifteen-bit bit serial controller, the controller output would comprise fifteen output lines. Each output line is asserted high for one bit-period. Output lines of the controller output 525 that are asserted high at times corresponding to when the bit-serial adders (within the adder circuitry 522) must be initiated for the next addition operation are applied through output line 591 to the adder control circuitry 530.

The scaling circuitry 526 uses the input sequence and delayed versions of the input sequence to produce scaled terms necessary for the interpolated sequence. The scaling circuitry 526 comprises at least one bit-serial scaler for producing scaled versions of the input sequence and of the delayed versions of the input sequence.

The scaling circuitry output 527 can comprise a single output line or multiple output lines. For example, for an interpolation factor of M=4, the scaling circuitry 526 comprises two bit-serial scalers. The output of each bit-serial scaler is applied to a separate bit-serial adder within the adder circuitry 522. Therefore, for an interpolation factor of M=4, scaling circuitry output 527 comprises two output lines. For an interpolation factor of M=2, the only interpolation term is a+b; no scaling of any terms is necessary. Therefore, for an interpolation factor of M=2, there is no need for scaling circuitry 526.

The multiplexer 528 is for switching the sign bit of the terms applied to the input of the multiplexer 528 to the multiplexer output 529. The sign bit of each of the interpolated terms occurs for only a specific bit-period of the bit-serial controller 524 cycle, so it is necessary to switch each input of the multiplexer 528 to the multiplexer output 529 at a specific, predetermined time with respect to the bit-serial controller 524 cycle. A control signal is thus necessary to switch the input terms present at the multiplexer 528 input to the multiplexer output 529. For some implementations, a second portion of the multiple control signals produced by the bit serial controller 524, is applied directly to the multiplexer 528. This second portion of the multiple control signals is produced on a control line that comprises at least one of the output lines of the controller output 525. An example of this is the bit-serial linear interpolator with sliced output 400 (FIG. 4).

Other implementations of the bit-serial linear interpolator with sliced output 500 require multiplexer and latch logic 532 (also generally referred to as logic circuitry), comprising conventional combinational logic, to produce the control signal for the multiplexer 528. In fact, for the bit-serial linear interpolator with sliced output 200 (FIG. 3), the multiplexer and latch logic 532 produces control signals on multiple control lines (376 and 378). Thus, a second portion of the multiple control signals, produced by bit-serial controller 524 and appearing on output lines 593, is applied to a first portion of the multiplexer and latch logic 532 to produce the multiplexer control signal.

For the completion of the slice operation, the latch 534 then latches each sign bit of the interpolated sequence to the final output 535 for a predetermined duration of time. For example, when the word length of the input sequence is twelve bits long, the bit-serial controller is a twenty-four bit bit-serial controller, and the interpolation factor is M=4, the sign bit is latched to the final output for three bit periods. It will be obvious to those skilled in the art that for other input word lengths, different bit-serial controllers, and different interpolation factors, the sign bit will be latched to the final output 535 for different predetermined durations.

Since the latch 534 must latch a new sign bit to the final output at a specific, predetermined times, a control signal is needed to control the latch 534. Therefore, a third portion of the multiple control signals, produced by the bit-serial controller 524 and appearing on output lines 593 of the controller output 525, is applied to a second portion of the multiplexer and latch logic 532 to produce the latch control signal on line 533.

The new bit-serial linear interpolator with sliced output 500 can be used implement the bit-serial linear interpolator 200 (FIG. 3) and the bit-serial linear interpolator 400 (FIG. 4). It will be obvious to those skilled in the art that the bit-serial linear interpolator with sliced output 500 can be adopted to handle many other different input word lengths, interpolation factors, and bit-serial controllers.

Figure 6:
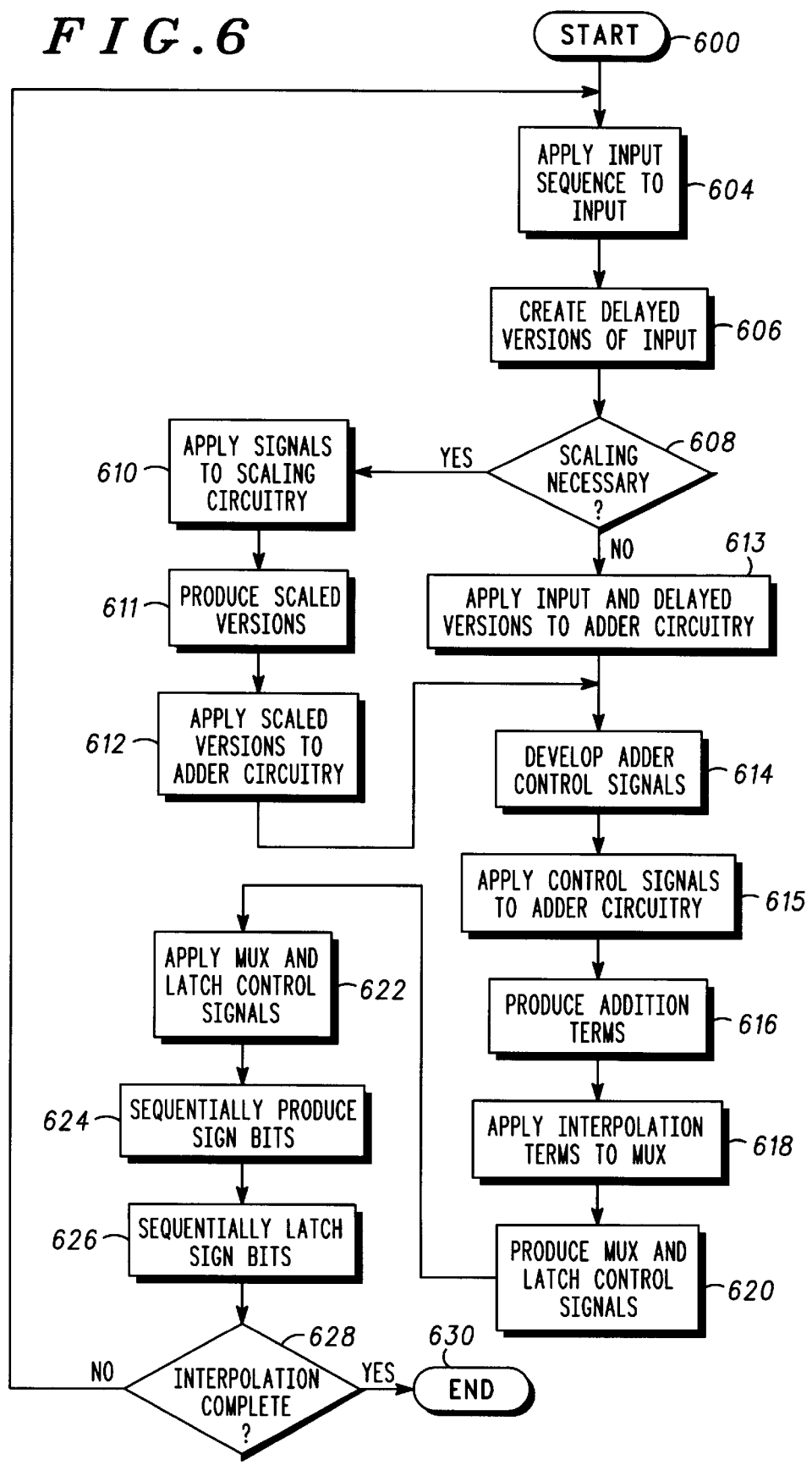
FIG. 6 is a flow chart illustrating a method of bit-serial linear interpolation with sliced output in accordance with the present invention.

FIG. 6 is a flow chart illustrating a method of bit-serial linear interpolation with sliced output. The method is started at 600, and at block 604 the input sequence to be interpolated is applied to an input port. The input sequence is coupled to delay circuitry so that delayed versions of the input sequence can be produced at block 606.

At decision block 608, it is determined if a scaling operation needs to be performed. If scaling is necessary, portions of the input sequence and the delayed versions of the input sequence are applied to scaling circuitry at block 610. The scaling circuitry then produces scaled versions of the input sequence and the delayed versions of the input sequence at block 611. The scaled versions are then coupled to adder circuitry at block 612. If scaling is not necessary, portions of the input sequence and the delayed versions of the input sequence are coupled to the adder circuitry at block 613.

At block 614 control signals for the adder circuitry are developed, and the control signals are applied to the adder circuitry at block 615. The adder circuitry produces the addition terms at block 616. The interpolation terms, which generally comprises the input sequence, delayed versions of the input sequence, scaled delayed versions of the input sequence, and the addition terms, are applied to a multiplexer at block 618.

The multiplexer and latch control signals are produced at block 620, and the control signals are applied to the multiplexer and the latch at block 622. The multiplexer then sequentially produces the sign bits of each interpolation term at block 624, and the sign bits are sequentially latched to the final output at block 626.

If it is determined at decision block 628 that the interpolation with sliced output is complete, the process ends at block 630. If the interpolation with sliced output is not finished, the process continues, starting at block 604.

The previous description of the preferred embodiments are provided to enable any person skilled in the art to make or use the bit-serial linear interpolator with sliced output. Various modifications to these embodiments will be readily apparent to those skilled in the art, and the generic principles defined herein may be applied to other embodiments without the use of the inventive faculty.

What is claimed is:

1. A bit-serial linear interpolator with sliced output comprising:

a bit-serial controller for receiving a clock signal and producing multiple control signals;

delay circuitry for receiving an input sequence and the clock signal, the delay circuitry producing delayed versions of the input sequence;

adder circuitry coupled to receive the input sequence and the delayed versions of the input sequence for producing addition terms in response to the clock signal and a first portion of the multiple control signals;

a multiplexer coupled to receive multiple input terms including at least one of the delayed versions of the input sequence and the addition terms for sequentially producing at its output, in response to a second portion of the multiple control signals, a multiplexed signal that has a sign bit of each of the multiple input terms;

logic circuitry coupled to receive a third portion of the multiple control signals for producing a latch control signal; and a latch coupled to receive the multiplexed signal and producing a final output signal in response to the clock signal and the latch control signal.

2. The bit-serial linear interpolator with sliced output as in claim 1, further comprising scaling circuitry coupled to receive the clock signal, the input sequence, and the delayed versions of the input sequence, the scaling circuitry for producing scaled signals that are scaled versions of the input sequence and scaled versions of the delayed versions of the input sequence, wherein the scaled signals are applied to the adder circuitry for producing at least one of the addition terms.

3. The bit-serial linear interpolator with sliced output as in claim 1, further comprising adder control circuitry coupled to receive the first portion of the multiple control signals and producing adder circuitry control signals, the adder circuitry producing the addition terms in response to the clock signal and the adder circuitry control signals, and wherein the logic circuitry is coupled to receive the second portion of the multiple control signals for producing a multiplexer control signal, the multiplexer sequentially producing the multiplexed signal in response to the multiplexer control signal.

4. The bit-serial linear interpolator with sliced output as in claim 3, further comprising scaling circuitry coupled to receive the clock signal, the input sequence, and the delayed versions of the input sequence, the scaling circuitry for producing scaled signals that are scaled versions of the input sequence and scaled versions of the delayed versions of the input sequence, wherein the scaled signals are applied to the adder circuitry for producing at least one of the addition terms.

5. The bit-serial linear interpolator with sliced output as in claim 4, wherein the delay circuitry comprises series connected delay elements having multiple tap points for producing the delayed versions of the input sequence, wherein the multiple tap points are for coupling the input sequence and the delayed versions of the input sequence to the adder circuitry and the scaling circuitry.

6. The bit-serial linear interpolator with sliced output as in claim 5, wherein the adder circuitry comprises at least one bit-serial adder for producing the addition terms.

7. The bit-serial linear interpolator with sliced output as in claim 6, wherein the latch comprises a D flip-flop.

8. The bit-serial linear interpolator with sliced output as in claim 7, wherein the bit-serial controller comprises a shift register having a last register output coupled to a first register input and having multiple output lines.

9. The bit-serial linear interpolator with sliced output as in claim 1, wherein the delay circuitry comprises series connected delay elements having multiple tap points for producing the delayed versions of the input sequence, wherein the multiple tap points are for coupling the input sequence and the delayed versions of the input sequence to the adder circuitry.

10. The bit-serial linear interpolator with sliced output as in claim 9, wherein the adder circuitry comprises at least one bit-serial adder for producing the addition terms.

11. A method of bit-serial linear interpolation with sliced output comprising the steps of:
   creating delayed versions of an input sequence in response to a clock signal;
   producing adder control signals in response to the clock signal;
   using the input sequence and the delayed versions of the input sequence to produce addition terms in response to the adder control signals and the clock signal;
   producing a multiplexer control signal in response to the clock signal;
   producing a latch control signal in response to the clock signal;
   sequentially producing, in response to the multiplexer control signal, sign bits of each of the addition terms and at least one of the input sequence and the delayed versions of the input sequence; and
   sequentially latching the sign bits in response to the latch control signal and the clock signal.

12. The method of bit-serial linear interpolation with sliced output as in claim 11, further comprising the step of producing at least one scaled signal in response to the clock signal, wherein the at least one scaled signal is a scaled version of at least one of the input sequence and the delayed versions of the input sequence, the at least one scaled signal used for producing at least one of the addition terms.

13. A radiotelephone comprising:
   a controller for controlling the radiotelephone;
   a synthesizer for generating RF signals;
   a transmitter for transmitting transmit data using the RF signals;
   a receiver for receiving receive data using the RF signals, the receiver including a bit-serial linear interpolator with sliced output comprising:
      a bit-serial controller for receiving a clock signal and producing multiple control signals;
      delay circuitry for receiving an input sequence and the clock signal, the delay circuitry producing delayed versions of the input sequence;
      adder circuitry coupled to receive the input sequence and the delayed versions of the input sequence for producing addition terms in response to the clock signal and a first portion of the multiple control signals;
      a multiplexer coupled to receive multiple input terms including at least one of the delayed versions of the input sequence and the addition terms for sequentially producing at its output, in response to a second portion of the multiple control signals, a multiplexed signal that has a sign bit of each of the multiple input terms;
      logic circuitry coupled to receive a third portion of the multiple control signals for producing a latch control signal; and
      a latch coupled to receive the multiplexed signal and producing a final output signal in response to the clock signal and the latch control signal.

14. The bit-serial linear interpolator with sliced output as in claim 13, further comprising scaling circuitry coupled to receive the clock signal, the input sequence, and the delayed versions of the input sequence, the scaling circuitry for producing scaled signals that are scaled versions of the input sequence and scaled versions of the delayed versions of the input sequence, wherein the scaled signals are applied to the adder circuitry for producing at least one of the addition terms.

15. The bit-serial linear interpolator with sliced output as in claim 13, further comprising adder control circuitry coupled to receive the first portion of the multiple control signals and producing adder circuitry control signals, the adder circuitry producing the addition terms in response to the clock signal and the adder circuitry control signals, and wherein the logic circuitry is coupled to receive the second portion of the multiple control signals for producing a multiplexer control signal, the multiplexer sequentially producing the multiplexed signal in response to the multiplexer control signal.

16. The bit-serial linear interpolator with sliced output as in claim 15, further comprising scaling circuitry coupled to receive the clock signal, the input sequence, and the delayed versions of the input sequence, the scaling circuitry for producing scaled signals that are scaled versions of the input sequence and scaled versions of the delayed versions of the input sequence, wherein the scaled signals are applied to the adder circuitry for producing at least one of the addition terms.

17. The bit-serial linear interpolator with sliced output as in claim 16, wherein the delay circuitry comprises series connected delay elements having multiple tap points for producing the delayed versions of the input sequence, wherein the multiple tap points are for coupling the input sequence and the delayed versions of the input sequence to the adder circuitry and the scaling circuitry.

18. The bit-serial linear interpolator with sliced output as in claim 17, wherein the adder circuitry comprises at least one bit-serial adder for producing the addition terms.

19. The bit-serial linear interpolator with sliced output as in claim 18, wherein the latch comprises a D flip-flop.

20. The bit-serial linear interpolator with sliced output as in claim 19, wherein the bit-serial controller comprises a shift register having a last register output coupled to a first register input and having multiple output lines.

21. The bit-serial linear interpolator with sliced output as in claim 13, wherein the delay circuitry comprises series connected delay elements having multiple tap points for producing the delayed versions of the input sequence, wherein the multiple tap points are for coupling the input sequence and the delayed versions of the input sequence to the adder circuitry.

22. The bit-serial linear interpolator with sliced output as in claim 21, wherein the adder circuitry comprises at least one bit-serial adder for producing the addition terms.

* * * * *